United States Patent
Jeraj et al.

(10) Patent No.: US 11,616,492 B1
(45) Date of Patent: Mar. 28, 2023

(54) TIME-ADAPTIVE RF HYBRID FILTER STRUCTURES

(71) Applicant: L3Harris Technologies, Inc., Melbourne, FL (US)

(72) Inventors: Janez Jeraj, Farmington, UT (US); Patrick M. Ryan, Salt Lake City, UT (US); Osama S. Haddadin, Salt Lake City, UT (US)

(73) Assignee: L3HARRIS TECHNOLOGIES, INC., Melbourne, FL (US)

( * ) Notice: Subject to any disclaimer, the term of this patent is extended or adjusted under 35 U.S.C. 154(b) by 0 days.

(21) Appl. No.: 17/538,171

(22) Filed: Nov. 30, 2021

(51) Int. Cl.
| H03K 5/00 | (2006.01) |
| H03H 17/02 | (2006.01) |
| H03K 5/01 | (2006.01) |
| H03H 17/00 | (2006.01) |

(52) U.S. Cl.
CPC ............ *H03H 17/02* (2013.01); *H03K 5/01* (2013.01); *H03H 2017/0081* (2013.01); *H03K 2005/00058* (2013.01)

(58) Field of Classification Search
CPC .. H03H 17/02; H03H 2017/0081; H03K 5/01; H03K 2005/00058
USPC ........................................................ 327/552
See application file for complete search history.

(56) References Cited

U.S. PATENT DOCUMENTS

| 5,115,243 | A * | 5/1992 | Perry | G01S 13/87 342/158 |
| 6,160,856 | A * | 12/2000 | Gershon | H03C 5/00 333/149 |
| 6,564,045 | B1 * | 5/2003 | Fransis | H03D 7/165 455/190.1 |
| 7,324,794 | B2 * | 1/2008 | Chari | H04B 7/084 455/139 |
| 7,451,049 | B2 * | 11/2008 | Feiereisel | H04J 3/0682 702/68 |
| 7,525,493 | B2 * | 4/2009 | Iwai | H01Q 1/245 343/702 |
| 8,058,949 | B2 * | 11/2011 | Ko | H03H 7/065 333/167 |
| 8,085,108 | B2 * | 12/2011 | Philippe | H04B 1/04 375/300 |
| 8,290,450 | B2 * | 10/2012 | Hammerschmidt | H04B 17/21 455/115.2 |
| 8,730,104 | B2 * | 5/2014 | Sharawi | H03F 3/68 342/372 |
| 9,300,444 | B2 * | 3/2016 | Hormis | H04B 17/17 |
| 9,602,143 | B1 * | 3/2017 | Steinbrecher | H01Q 3/28 |

(Continued)

*Primary Examiner* — Ryan Jager
(74) *Attorney, Agent, or Firm* — Workman Nydegger

(57) ABSTRACT

A digitally controlled analog filter device. The digitally controlled analog filter device includes one or more digitally controlled analog signal amplifiers. The digitally controlled analog signal amplifiers are configured to have a gain of the digitally controlled analog signal amplifiers controlled by digital signals. The digitally controlled analog filter device further includes one or more analog time delay circuits coupled to signal input nodes of the digitally controlled analog signal amplifiers. The analog time delay circuits are configured to implement an analog signal delay. The digitally controlled analog filter device further includes a digital closed loop control circuit coupled to the digitally controlled analog signal amplifiers to digitally control the gain of the digitally controlled analog signal amplifiers.

22 Claims, 6 Drawing Sheets

(56) References Cited

U.S. PATENT DOCUMENTS

| | | | |
|---|---|---|---|
| 9,614,594 B2* | 4/2017 | Kim | H04L 5/0023 |
| 9,960,883 B1* | 5/2018 | Chakraborty | H03D 7/165 |
| 10,256,894 B2* | 4/2019 | Eitan | H04B 7/086 |
| 10,411,943 B2* | 9/2019 | Qian | H03F 3/245 |
| 10,637,153 B2* | 4/2020 | Luo | H01Q 3/2658 |
| 10,826,738 B2* | 11/2020 | Pan | H03F 3/21 |
| 11,012,201 B2* | 5/2021 | Hormis | H04L 1/243 |
| 11,128,326 B2* | 9/2021 | Nguyen | H03G 1/0029 |
| 11,277,108 B1* | 3/2022 | Ibrahim | H03F 3/195 |
| 11,290,093 B1* | 3/2022 | Chakraborty | H03K 5/01 |
| 11,368,143 B1* | 6/2022 | Chakraborty | H03K 5/01 |
| 11,374,803 B2* | 6/2022 | Abdel Fattah | H03F 3/45475 |
| 11,381,227 B1* | 7/2022 | Ray | H03K 7/06 |
| 2003/0083031 A1* | 5/2003 | Eriksson | H03G 3/3089 |
| | | | 455/234.2 |
| 2005/0009483 A1* | 1/2005 | Eilts | H04W 52/52 |
| | | | 455/136 |
| 2005/0190875 A1* | 9/2005 | Feiereisel | H04J 3/0682 |
| | | | 375/356 |
| 2005/0260949 A1* | 11/2005 | Kiss | H04B 17/21 |
| | | | 455/67.14 |
| 2006/0068747 A1* | 3/2006 | Brobston | H03G 3/3068 |
| | | | 455/232.1 |
| 2007/0290930 A1* | 12/2007 | Krishnaswamy | H01Q 3/26 |
| | | | 331/25 |
| 2009/0040107 A1* | 2/2009 | Yun | H01Q 3/2605 |
| | | | 342/375 |
| 2010/0111227 A1* | 5/2010 | Philippe | H04B 1/04 |
| | | | 375/302 |
| 2013/0122802 A1* | 5/2013 | Wang | H04B 7/15578 |
| | | | 455/9 |
| 2017/0019067 A1* | 1/2017 | Chakraborty | H03D 7/1441 |
| 2017/0104508 A1* | 4/2017 | Mukundagiri | H04B 5/0031 |
| 2019/0190765 A1* | 6/2019 | Murali | H04L 27/0014 |
| 2021/0143784 A1* | 5/2021 | Khalaf | H03G 1/0088 |

* cited by examiner

TIME-ADAPTIVE RF HYBRID FILTER STRUCTURES

BACKGROUND

Background and Relevant Art

Signal processing involves the ubiquitous use of filters. Filters can be used for a number of different purposes including isolating frequency components of the signal, removing frequency components of a signal, performing timing adjustments on components of a signal, amplifying and/or attenuating components of a signal, etc. The earliest forms of filters typically used combinations of analog components and/or manual controls to implement filtering functionality. For example, various combinations of inductors, resistors, and/or capacitors could be arranged in various topologies to isolate certain frequency components within a signal. Further, various transistor-based amplifiers could be used to amplify and/or attenuate input signals. Further, various transmission lines could be used to create delays for signals by taking advantage of wave propagation properties, including finite transmission speeds, in the transmission lines.

However, these early analog filters were typically very static in nature in that their configurations and signal responses were inflexible once the filters were implemented. While the filters could be implemented in a variable fashion by implementing variable components, typically those components required manual intervention such as physical turning of dials and knobs to control component properties. However, those analog filters were not typically controllable by digital control systems such as computers and other digital control systems.

Modern filtering functionality is implemented typically using digital signal processing principles. In particular, digital signal processing principles include converting analog signals to digital representations and then manipulating the digital representations using various computer systems performing mathematical functions on the digital representations. Because digital filtering is controlled by computer functionality and mathematical principles, algorithms executed by the computers to implement the digital filters can be quickly changed to implement very controllable filtering functionality.

Thus, digital filters are useful and widely used but are not suitable for every application. One of their drawbacks is that they introduce or raise the (quantization) noise floor as they quantize both signal and coefficients. Signal quantization introduces an irrecoverable noise floor that cannot be cleaned up with subsequent (analog or digital) filtering. Furthermore, quantization and Digital Signal Processing (DSP) introduces processing delays that may be too large for certain high-speed applications. Additionally, they require high-speed Analog-to-Digital Converters (ADCs) and sometimes Digital to Analog Converters (DACs).

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

One embodiment illustrated herein includes a digitally controlled analog filter device. The digitally controlled analog filter device includes one or more digitally controlled analog signal attenuators and/or amplifiers. Amplifiers here are considered in a general sense, as devices that change signal gain through either attenuation or amplification. The digitally controlled analog signal amplifiers/attenuators are configured to have a gain of the digitally controlled analog signal amplifiers controlled by digital signals. The digitally controlled analog filter device further includes one or more analog time delay circuits coupled to signal input nodes of the digitally controlled analog signal amplifiers. The analog time delay circuits are configured to implement an analog signal delay. The digitally controlled analog filter device further includes a digital closed loop control circuit coupled to the digitally controlled analog signal amplifiers to digitally control the gain of the digitally controlled analog signal amplifiers.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Figure 1:
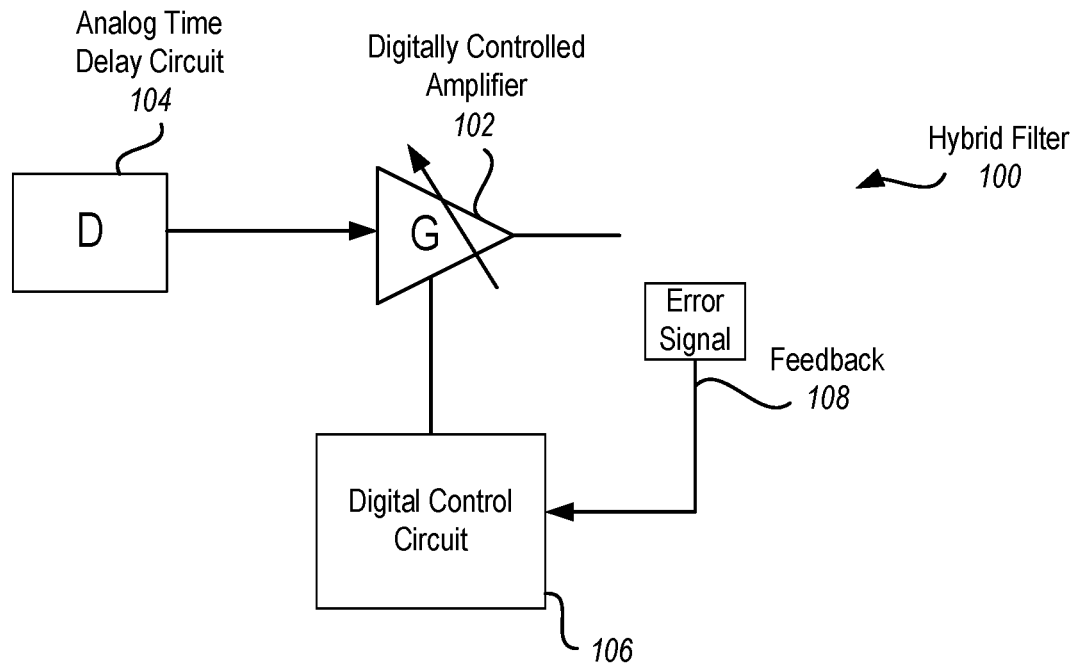
FIG. 1 illustrates a hybrid filter.

Embodiments illustrated herein implement a hybrid filter that allows for digital control while nonetheless implementing analog filtering. In particular, some embodiments of the invention implement a custom time-adaptive RF filter. The filter is composed of various analog RF components and controlled digitally. Further, embodiments include digital open or closed loop feedback elements to digitally control the various analog RF components. Analog filters can handle special functions such as antialiasing filtering, direct filtering of high-powered signals and can have a very low noise floor as they do not quantize the signal. Embodiments illustrated herein include a hybrid filter that quantizes only coefficients (i.e., a control signal) but does not quantize the filtered signal thus allowing a digitally controlled analog filter to be implemented.

Previously, in typical analog based filter circuits, delays caused by delay circuits may not all be the same. For example, different delay circuits may cause different time delays. Alternatively or additionally, delay circuits may be frequency dependent where delays are dependent on frequency input into the delay circuits (e.g., insertion slope, non-constant slope, etc.) and where such frequency dependencies vary from delay circuit to delay circuit. Some embodiments use fixed-slope and adjustable-slope voltage variable equalizers for gain flattening and frequency-dependent loss compensation. Slope equalizers used herein are typically filters that introduce frequency dependent losses opposite to those naturally present in a system. Typically that means equalizing and flattening the broadband insertion loss of the system, where the slope equalizers provide positive slope. Delay circuits may be temperature dependent where delays are dependent on temperature, and where temperature dependency changes from delay circuit to delay circuit. Delay circuits may age with time such that delays change as the delay circuits age, and where age dependency changes from delay circuit to delay circuit. Delay circuits may (nonlinearly) change value when going from one delay value to another, and this change in value may be different from delay circuit to delay circuit. Alternatively or additionally, delay circuits may be supply dependent where delays are dependent on supply voltages used to power the delay circuits. Etc.

Similarly, in previous analog variable gains, similar effects as analog delays are observed. Further, such gains/amplifiers are also subject to nonlinearities including saturation.

Similarly, previous analog combiners have limited bandwidth and are asymmetrical in general.

Other analog components also have non-idealities. For example, traces and cables may vary in length causing various delay and other effects.

While adaptive algorithms have been developed for digital filters using digital components, such that the digital filters are able to be implemented with nearly ideal implementation of functions such as delays, summers, and gains, traditional analog filters present much more difficulty in compensating for component to component differences.

In some embodiments illustrated herein, even though the illustrated hybrid filters do not have 'ideal' components, adaptive digital algorithms can be implemented to compensate for the non-idealities described above. One such example algorithm is a modified Least Mean Squares (LMS) adaptive algorithm. Thus, digital algorithms and digital controls can be used to compensate for various issues.

That is, these various time, frequency, age, saturation, supply, slope etc. variabilities can be compensated for using digital closed loop feedback control circuits as illustrated herein to adjust gains and/or delays.

Referring now to FIG. 1, an example is illustrated. FIG. 1 illustrates a hybrid filter 100. In the example illustrated in FIG. 1, the hybrid filter includes a digitally controlled analog signal amplifier 102 and an analog time delay circuit 104. The digitally controlled analog signal amplifier 102 and the analog time delay circuit 104 are configured to be controlled by digital signals. FIG. 1 further illustrates a digital control circuit 106 coupled to the digitally controlled analog signal amplifier 102. In the example illustrated in FIG. 1 a signal is input into the input node of the analog time delay circuit 104. The analog time delay circuit 104 causes a delay from when the signal is input at the input node of the analog time delay circuit 104 to when the signal reaches the input node of the digitally controlled analog signal amplifier 102. The gain of the digitally controlled analog signal amplifier 102 is controlled by a digital control circuit 106. For example, the digital control circuit 106 can adjust how much gain is applied to the input signal. Note that gain as used herein can be above or below unity (or even at unity if the filter is implementing a buffer).

When the gain of the digitally controlled analog signal amplifier 102 is below unity (i.e., when the absolute value of the gain is less than one), then the digitally controlled analog signal amplifier 102 will act as an attenuator attenuating the input signal to cause the output of the digitally controlled analog signal amplifier 102 to be smaller than the input signal. In contrast, when the digital control circuit 106 causes the absolute value of the gain of the digitally controlled analog signal amplifier 102 to be greater than 1, then the output signal of the hybrid filter 100 will be larger than the input signal input into the input port of the analog time delay circuit 104.

It should be noted, FIG. 1 illustrates feedback 108. The feedback 108 is provided from an error providing circuitry to the digital control circuit 106 so as to create a digital closed loop control circuit. Alternatively or additionally, an open loop control circuit can also be used. This can allow the digital control circuit 106 to adjust the gain of the digitally controlled analog signal amplifier 102 to achieve a particular signal output of the digitally controlled analog signal amplifier 102, and thus the hybrid filter 100.

Figure 2:
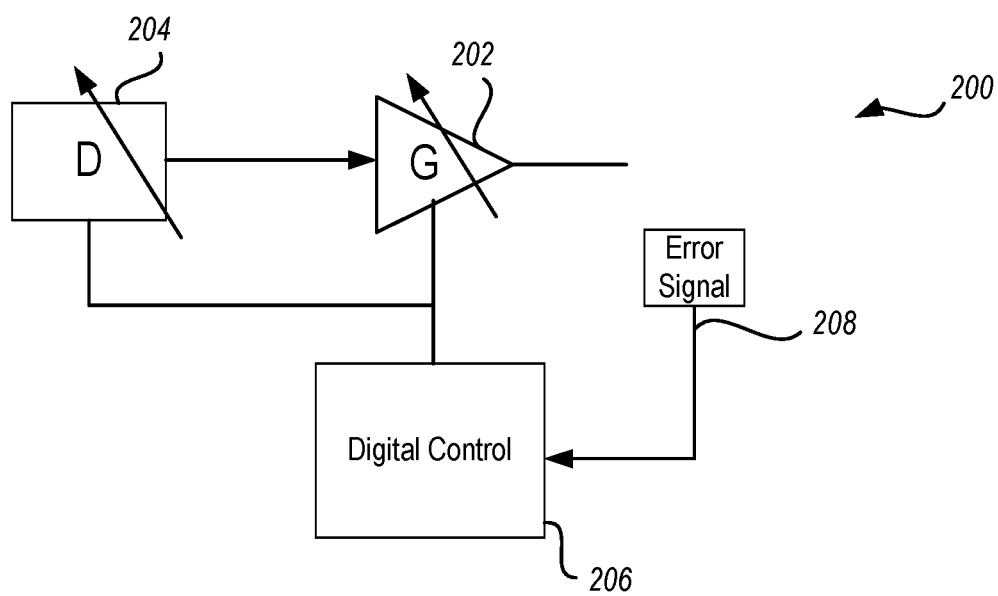
FIG. 2 illustrates an alternative example of a hybrid filter.

Referring now to FIG. 2, an alternative example is illustrated. Similar to FIG. 1, the hybrid filter 200 illustrated in FIG. 2 includes a digitally controlled analog signal amplifier 202, a digital control circuit 206, and feedback 208. In contrast to the device illustrated in FIG. 1 however, the analog time delay circuit 204 is digitally controlled by the digital control circuit 206. In particular, the digital control circuit 206 can adjust the length of the delay implemented by the analog time delay circuit 204.

Figure 3:
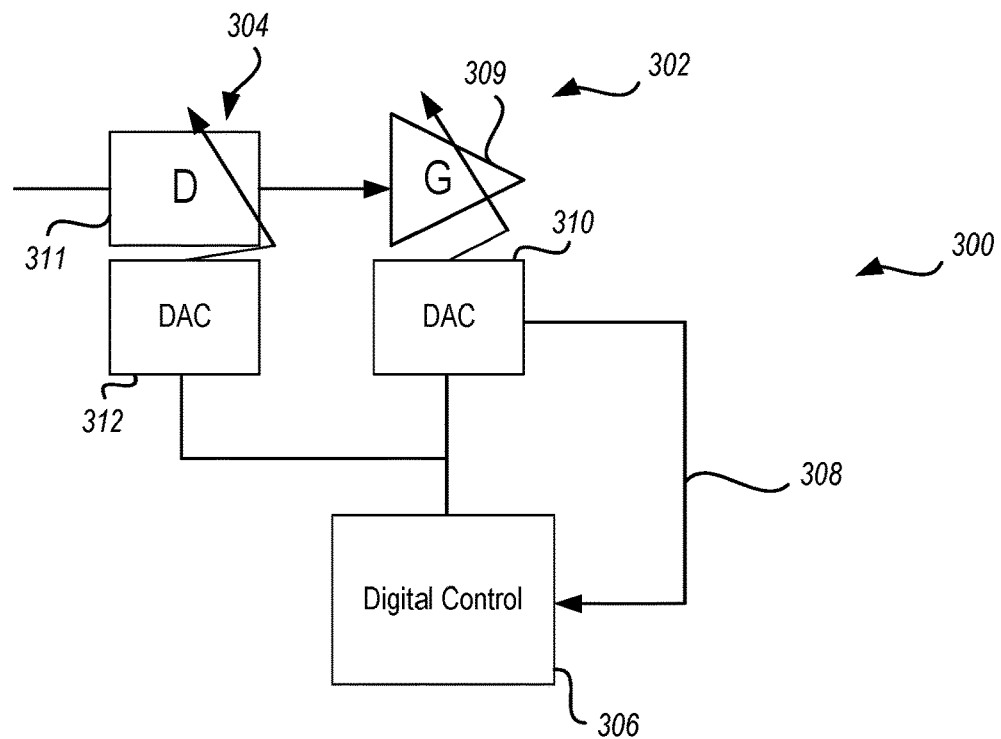
FIG. 3 illustrates an example of a hybrid filter with additional details illustrated.

Referring now to FIG. 3, additional details are illustrated. In some embodiments, the digitally controlled analog signal amplifier 302 and the digitally controlled analog time delay circuit 304 may be implemented by using conventional analog amplifiers 309 and conventional analog time delay circuits 311 coupled to digital to analog converters 310 and 312 respectively. For example, in one embodiment, the digitally controlled analog signal amplifier 302 can be implemented by adjusting the power supply voltage to the analog amplifier 309 using the digital-to-analog converter (DAC) 310, thus effectively controlling the gain of the analog amplifier 309. In an alternative embodiment, the digitally controlled analog signal amplifier 302 can be implemented by adjusting the voltage to the analog attenuator 309 using the digital-to-analog converter 310, thus effectively controlling the gain of the analog gain 309. With respect to the time delay circuit 311, the digital-to-analog converter 312 can be used to control various RF switches or other components in the time delay circuit 311 to implement the digitally controlled analog time delay circuit 304. Note that the delay circuit 304 and amplifier 309 can also be directly controlled digitally (e.g., with a digital step attenuator) and not necessarily through a DAC.

Figure 4:
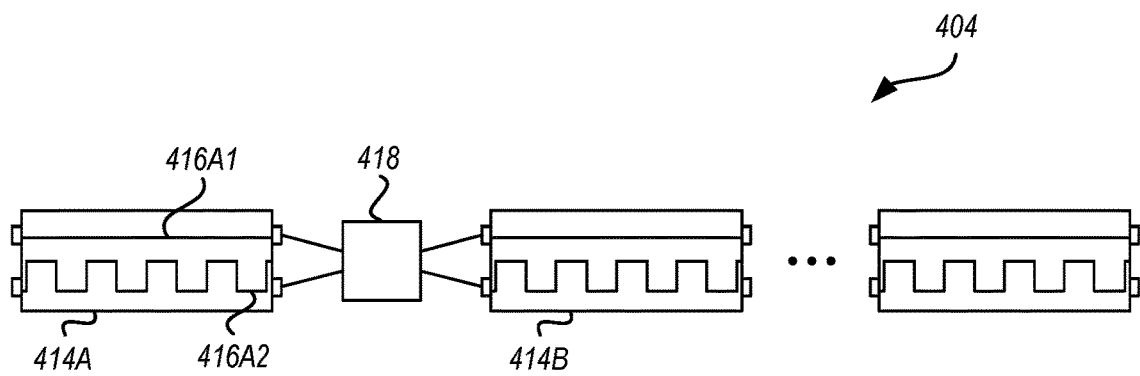
FIG. 4 illustrates a digitally delayed control circuit.

With respect to the digitally controlled analog time delay circuit, additional details are illustrated in FIG. 4 by example of the digitally controlled analog time delay circuit 404. FIG. 4 illustrates selectable transmission lines which can be used to configure the length of delay for an analog time delay circuit. In particular, FIG. 4 illustrates two selectable transmission line modules 414A and 414B, while the ellipses and additional transmission line module indicate that any number of transmission line modules may be included. Each of the modules includes two transmission lines including a short path transmission line and a long path transmission line. For example, transmission line module 414A includes a short path transmission line 416A1 and a long path transmission line 416A2. A shorter delay is achieved by causing a signal to be transmitted on the short path transmission line 416A1 than the delay caused by causing a signal to be transmitted on the long path transmission line 416A2. As illustrated in FIG. 4, multiple selectable transmission line modules may be implemented in series and coupled to one another through selectable switches such as selectable switch 418. The selectable switch is able to couple a short path transmission line from one module to another short path transmission line of a different module, connect a short path transmission line from one module to a long path transmission line of a different module, connect a long path transmission line from one module to a short path transmission line of another module, or to connect a long path transmission line for one module to a long path transmission line of another module. In this way, using an appropriate number of selectable transmission line modules, interconnecting switches, and appropriate connections, a desired delay can be achieved. In some embodiments, the switch 418 (as well as other switches between transmission line modules) can be digitally controlled so as to create a digitally controlled analog time delay circuit such as those illustrated at 204 and 304.

Note that in some embodiments, additionally or alternatively, phase shift hardware may also be used to adjust delay for implementing the digitally controlled analog time delay circuit. In one example, such phase shift hardware may comprise a vector modulator.

Figure 5:
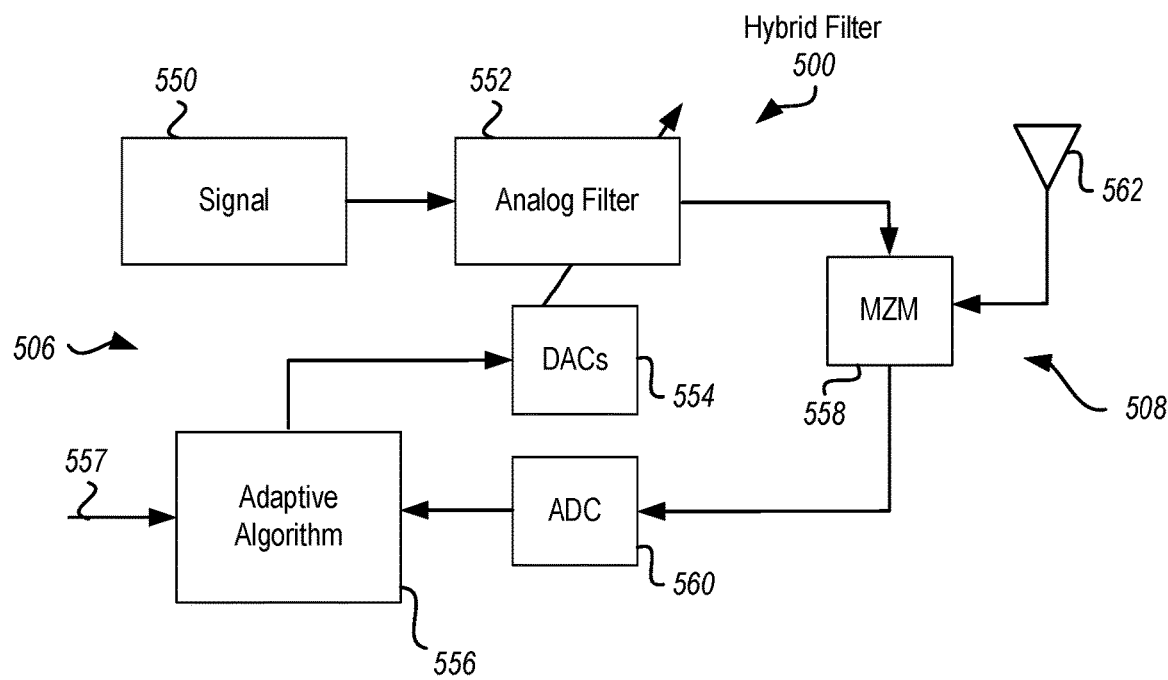
FIG. 5 illustrates another example of a hybrid filter with additional details.

Referring now to FIG. 5, one general implementation is illustrated. In the example illustrated in FIG. 5, a hybrid filter 500 is illustrated. The hybrid filter 500 includes an analog filter 552 and one or more digital-to-analog converters 554 allowing the analog filter to be controlled by a digital control circuit 506. In this particular example a signal 550 can be input into the hybrid filter 500. As noted previously, the hybrid filter 500 provides for analog filtering but where the analog filtering is adjustable and controllable by a digital control circuit 506. In this example, the digital control circuit 506 implements an adaptive algorithm 556. In the example illustrated in FIG. 5, feedback 508 is implemented by using a balun or a Mach-Zehnder Modulator (MZM) 558 in combination with an analog-to-digital converter (ADC) 560 to provide digital information to the adaptive algorithm 556. This allows the adaptive algorithm 556 to adjust the hybrid filter 552 based on output from the analog subtraction device 558 and a reference signal 557. This can be used to achieve desired signal output at the output of analog subtraction device 558. Note that an MZM is an optical interferometric structure made from a material with strong electro-optic effect (such as LiNbO3, GaAs, InP). Applying electric fields to the arms of such a device changes optical path lengths resulting in phase modulation. Combining two arms with different phase modulation converts phase modulation into intensity modulation. In an appropriate configuration, MZM behaves as an analog signal subtraction device similar to an RF balun. The advantage of a MZM over a balun is that MZM can handle significantly wider bandwidths of signals.

Note, it should be appreciated that even though antenna 562 is illustrated for outputting an output signal, in other embodiments, other types of channel elements such as transmission lines, horns, or other output elements may be used to output an output signal from the illustrated system.

Figure 6:
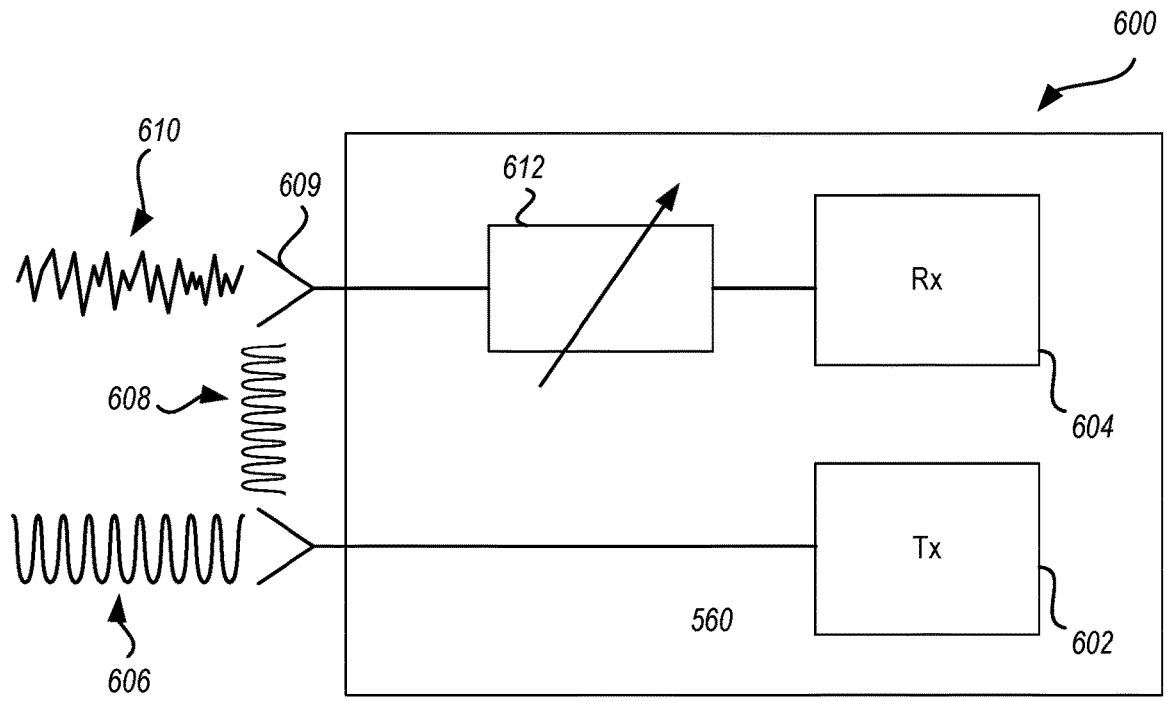
FIG. 6 illustrates a simultaneous transmit and receive system with a hybrid filter.

Referring now to FIG. 6, an example environment where some embodiments may be implemented is illustrated. Some embodiments may be implemented in environments where a system causes interference for the system itself. For example, some systems implement simultaneous transmit and receive (STAR). STAR systems simultaneously transmit and receive data using the same frequency band. This may result in a transmitted signal from the system interfering (i.e., self-generated interference) with a signal of interest received by the system. In particular, the system will receive a received signal which includes the signal of interest and noise. A portion of the noise may include interference caused by the signal transmitted by the system. To improve the received signal, it may be useful to model channel-distorted interference caused by the transmitted signal, and to subtract that interference from the received signal to improve detection of the signal of interest.

For example, referring to FIG. 6, a system 600 is illustrated. The system 600 includes a transmitter 602 and a receiver 604. The transmitter transmits a signal 606 from an antenna 607 intended to be directed at other systems. FIG. 6 further illustrates that a leakage signal 608 from the transmitted signal 606 is captured by the receive antenna 609 and is mixed with a signal of interest 610. The system 600 includes a hybrid filter 612 that is able to remove most if not all of the leakage signal 608 so as to allow the signal of interest 610 to be received by the receiver 604 with at least a portion of the leakage signal 608 removed allowing for better processing of the signal of interest 610.

Similar considerations may occur when implementing a co-site interference system. In a co-site interference system, a jammer is intentionally transmitted to attempt to jam adversaries. Similar to the example illustrated in FIG. 6, at least a portion of the jamming signal that has been intentionally introduced can be removed at the local receiver using a digitally controlled hybrid filter such as the hybrid filter 612 illustrated in FIG. 6.

Additional details will be illustrated below in conjunction with various other figures to illustrate how such a filter might function in these scenarios. Suffice it to say however at this point, the hybrid filters are able to construct a signal which models the (channel distorted) interference signal, such as by modeling the leakage signal 608. The modeled signal can then be subtracted from the signal received at the receive antenna 609 so as to cause the signal of interest 610 to remain while removing significant amounts of the leakage signal 608.

Figure 7:
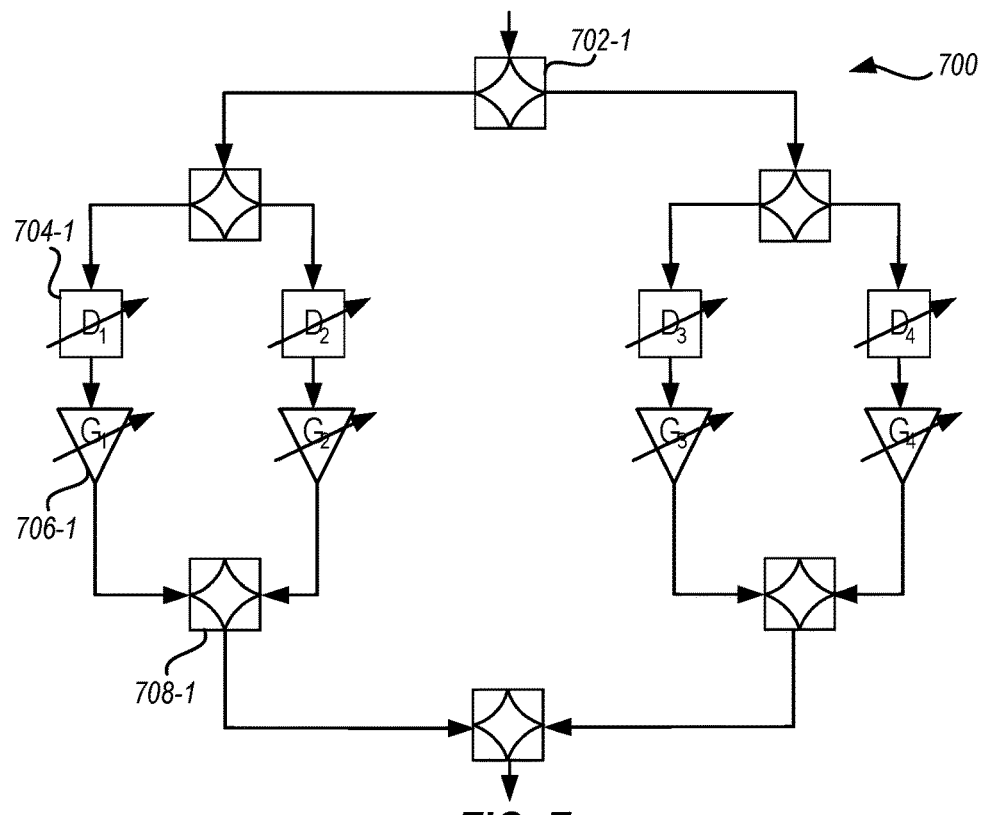
FIG. 7 illustrates a hybrid filter for implementing a reflection based filter.

Various examples will now be illustrated to illustrate how different hybrid filters can be implemented. FIG. 7 illustrates a hybrid filter which implements a reflection-based filter that can be used to implement a dynamic channel emulator. In particular, the hybrid filter 700 illustrated in FIG. 7 is able to model a multipath signal in an environment. For example, consider a case where a signal is transmitted in an environment where the signal may take multiple different paths simultaneously from a transmitter to a receiver. For example, a portion of the signal may be transmitted such that it is reflected off of buildings, aircraft wings, clouds, etc. before it reaches a receive antenna. This results in the signal arriving at the receive antenna in several different portions, where each of the different portions has a different power and arrives with a different delay with respect to each other. For example, portions of the signal may be absorbed thereby reducing power, portions of the signal may take a longer path thereby arriving with a delay with respect to other portions of the signal, etc.

The hybrid filter 700 illustrated in FIG. 7 is able to simulate a certain number of paths. In particular, the example illustrated in FIG. 7 is able to illustrate four paths of a multipath signal. As illustrated this is accomplished by using various signal splitters, such as signal splitters 702-1, various digitally controlled delay circuits such as the digitally controlled delay circuit 704-1, several amplifiers (note that amplifiers as used herein also include functionality for attenuation when the amplifiers have a gain with an absolute value that is less than 1 or buffering when the amplifiers have a gain of 1; i.e., the term "amplifier" as used herein is a device that controls signal gain through at least one of attenuation, amplification, or buffering) such as the digitally controlled amplifier 706-1, and various power combiners such as the power combiners 708-1. In particular, an input signal can be provided to the hybrid filter 700 at the input of the signal splitter 702-1. The input signal can be split as many times as necessary to model an appropriate number of paths, for example four paths as illustrated in the present example. Delays can be introduced by the digitally controlled delay circuits to simulate signal delays in an environment. Gains can be adjusted using the digitally controlled amplifiers to simulate signal absorption and other signal losses. As noted, delays and gains are applied for each of the different paths being simulated. Signals for each of the paths being simulated are then combined using appropriate combiners to produce a simulated signal from a multipath environment. This simulated signal can then be subtracted from a received signal to attempt to isolate a signal of interest by removing known interference components.

Thus, the reflection-based filter in FIG. 7 is composed of RF splitters and combiners, programmable wideband RF delays, where an analog RF signal can be delayed by some arbitrary time using digital control such as an FPGA or a micro-processor, and variable gain amplifiers or variable attenuators. Within each of these components, there may be several distinct subcomponents. For example, variable RF delay may be composed of a number of delay components, switches, amplifiers, pre- or post-equalizers, slope equalizers, digital circuitry etc.

Figure 8A:
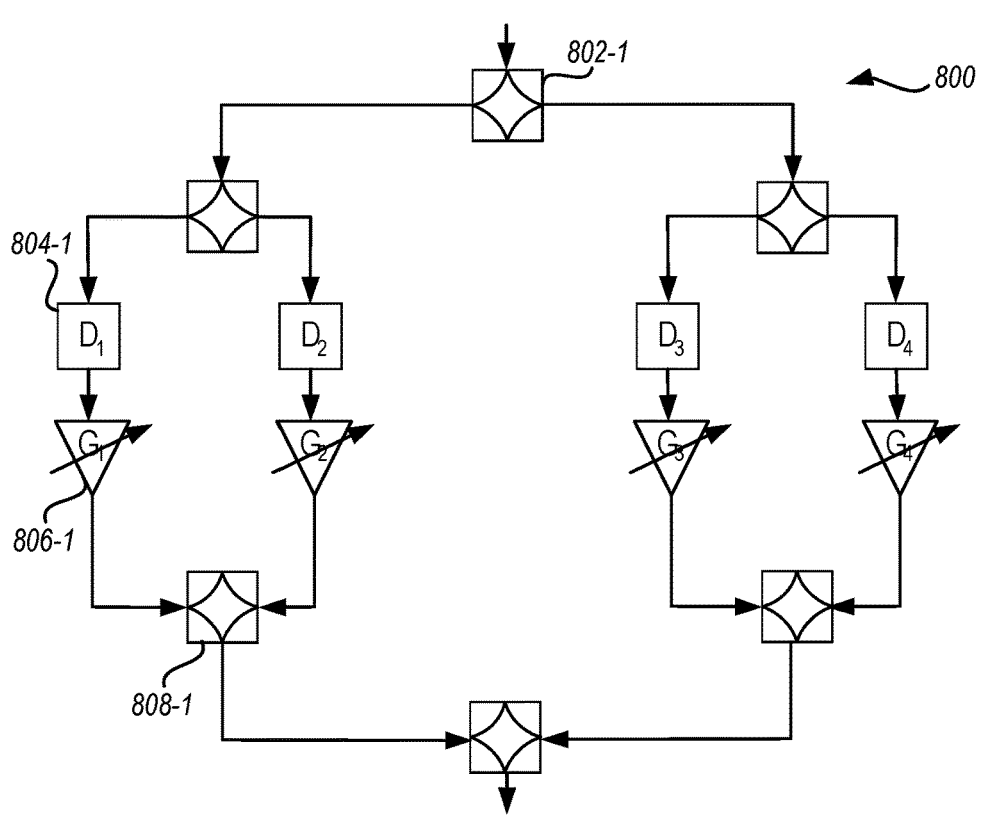
FIG. 8A illustrates a hybrid filter implementing an analog equivalent of a digital finite infinite response filter.

Referring now to FIG. 8A a simple analog equivalent of a digital finite infinite response (FIR) filter is illustrated. A FIR filter is a digital concept, however, embodiments can implement similar functionality, but using digitally controlled analog components in the form of a hybrid filter. Thus, a hybrid filter 800 is illustrated in FIG. 8A. In particular, the hybrid filter 800 illustrated in FIG. 8A can be implemented using known digital approaches for FIR filters but is able to perform analog filtering. For example, in some embodiments FIR filter coefficients can be identified using conventional digital signal processing operations. These FIR filter coefficients can then be used to control the gain of digitally controlled amplifiers, such as digitally controlled amplifier 806-1. For example, digital coefficients can be used in a fashion illustrated in FIG. 3 to control the gain of the digitally controlled amplifier 302. For example, coefficients of an FIR filter can be converted to analog voltages and/or signals which can be provided to digital to analog converters, which can be used to control the gain of an analog amplifier.

Note that FIG. 8A further illustrates, similar to FIG. 7, the use of signal splitters, such as signal splitter 802-1, delay circuits, such as delay circuit 804-1, digitally controlled analog amplifiers/attenuators such as digitally controlled analog amplifier 806-1, and power combiners, such as power combiner 808-1. Note that in the example illustrated in FIG. 8A, a plurality of delay circuits are illustrated. In some embodiments, each of the analog time delay circuits implement a similar or identical delay. In alternative embodiments, the analog time delay circuits may implement fixed delays that are different in time.

In contrast to the hybrid filter 700 illustrated in FIG. 7, the hybrid filter 800 uses delay circuits that are fixed in length rather than being digitally controlled. This facilitates the use of conventional digital FIR filter controls, but where the actual filtering is analog in nature. Thus, this approach has some benefits with respect to reflection-based architecture of FIG. 7 such as that it is simpler to adapt than the reflection-based filter architecture illustrated in FIG. 7, as adaptive algorithms can be based on known digital approaches.

Figure 8B:
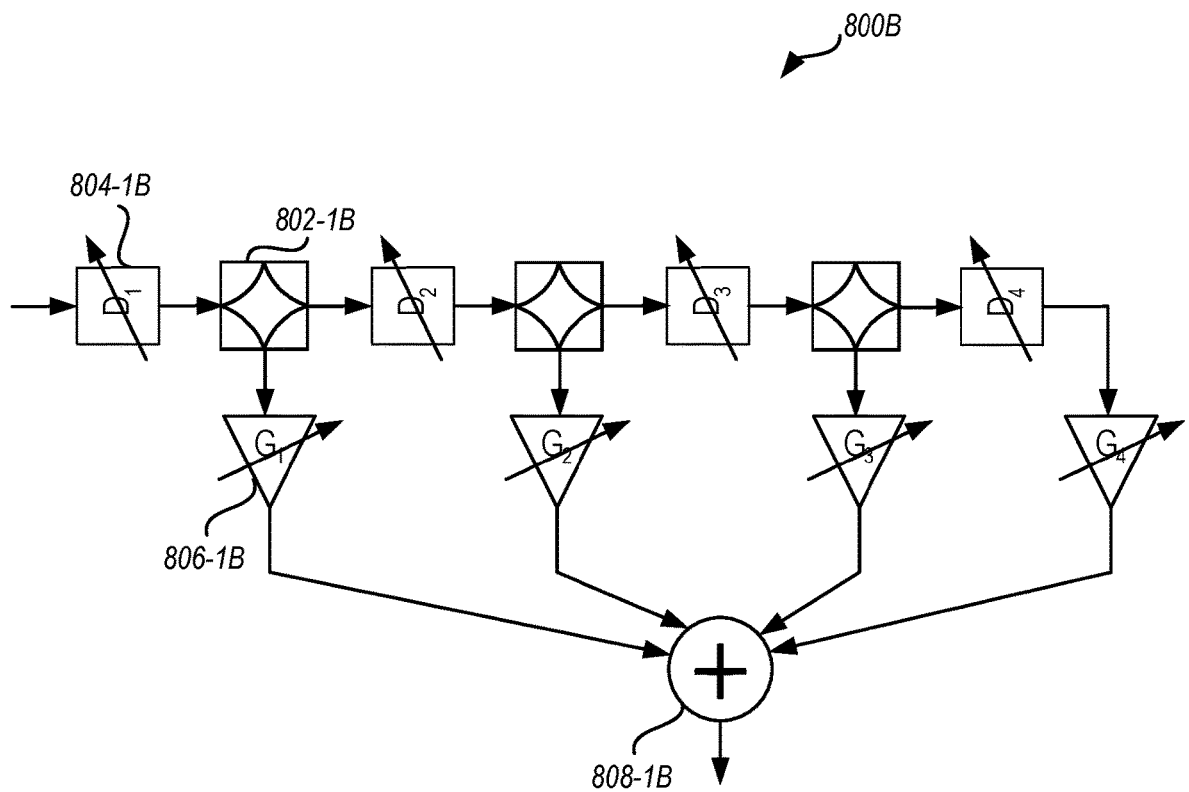
FIG. 8B illustrates another hybrid filter implementing an alternate version of an analog equivalent of a digital finite infinite response filter.

FIG. 8B illustrates another hybrid filter implementing an alternate version of an analog equivalent of a digital finite infinite response filter. In this example, FIG. 8B illustrates the use of signal splitters, such as signal splitter 802-1B, digitally controlled delay circuits, such as delay circuit 804-1B, digitally controlled analog amplifiers/attenuators such as digitally controlled analog amplifier 806-1B, and power combiners, such as power combiner 808-1B. Note that in the example illustrated in FIG. 8, a plurality of delay circuits are illustrated as being digitally controllable in contrast to the delay circuits of FIG. 8A.

Figure 9:
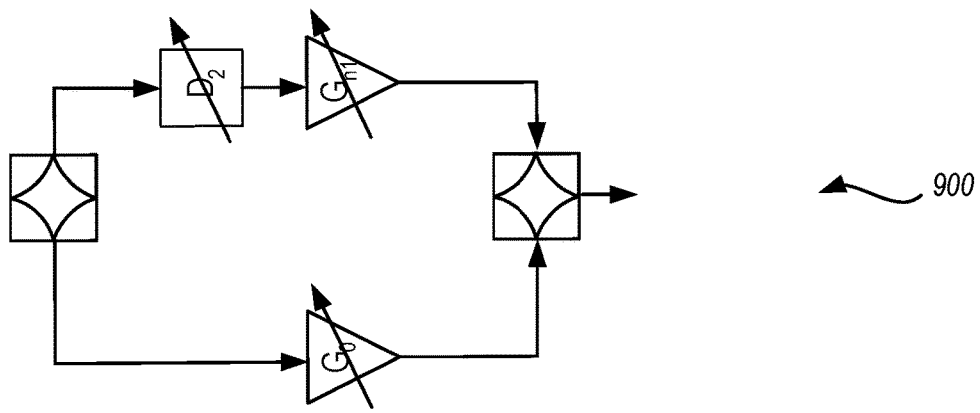
FIG. 9 illustrates a cascade architecture implementing a hybrid filter.
Figure 9:
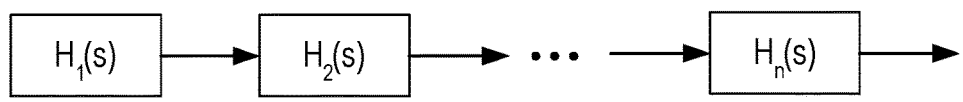

Referring now to FIG. 9, shows another cascade architecture implementing a hybrid filter 900. Hybrid RF filters are subject to many non-idealities that affect the algorithm and overall performance as depicted in the example in FIG. 9. In the example illustrated in FIG. 9, the element $H_n(s)$ is a first order element, but it can be expanded to implement a higher order filter.

Some embodiments of the invention may implement a so called analog twin of a digital circuit. In contrast to the well-known digital twin concept where a digital model represents a physical model, embodiments herein can implement a system where an analog twin of a digital system is implemented. For example, FIR filters are a digital signal processing concept. However, as shown in FIG. 8, an analog twin of a FIR filter can be implemented. In particular, in some embodiments, a digital system can implement a digital filter, such as a FIR filter to process signals. However, when the signals are finally processed, the processing will be relegated to the analog twin where coefficients of the FIR filter are used to control the analog delays and/or amplifiers of the analog twin. Thus, embodiments can implement an analog twin to implement an analog version of a digital system where control of the digital system is translated to control of the analog version of the digital system.

As illustrated herein, embodiments may be implemented to build highly flexible time-adaptive RF filter structures for various applications. For example, embodiments can be implemented for co-site interference cancellation as illustrated above. Other embodiments may be used for interference cancellation in STAR systems. Other embodiments may be used for adaptive (receive) RF equalization. Other embodiments may be used for adaptive anti-aliasing filters. Other embodiments may be used to implement analog repeat similar to Digital Radio Frequency Memory (DRFM) systems for spoofing. Other embodiments may be used for cross-polarization cancellation. Other embodiments may be used for interference cancellation in Multiple-Input Multiple-Output (MIMO) systems. Other embodiments may be used to implement system testing such as satellite and GPS testing and phase array radar & antenna testing. Other embodiments may be used for high speed serial logic. Other embodiments may be used for clock synchronization and timing of clock sources. Other embodiments may be used for clock and data recovery. Other embodiments may be used for broadband test and measurement. Other embodiments may be used for frequency synthesis. Other embodiments may be used for matched timing. Etc.

The following discussion now refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

Figure 10:
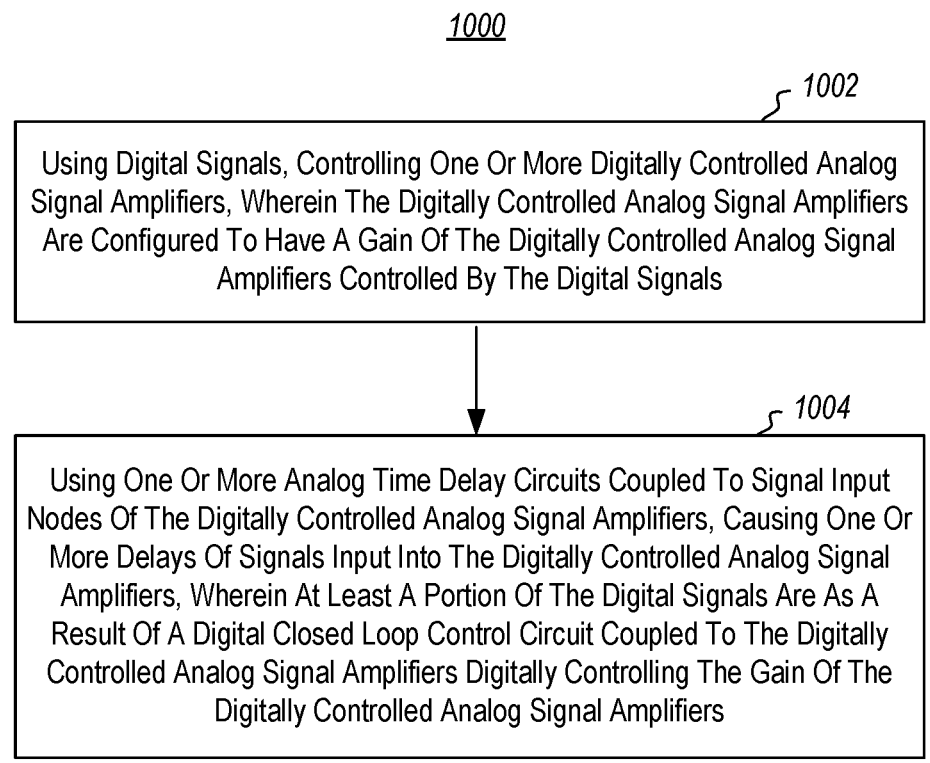
FIG. 10 illustrates a method for digitally controlling an analog filter device.

Referring now to FIG. 10, a method 1000 is illustrated. The method 1000 includes acts for digitally controlling an analog filter device. The method includes using digital signals, controlling one or more digitally controlled analog signal amplifiers (act 1002). The digitally controlled analog signal amplifiers are configured to have a gain of the digitally controlled analog signal amplifiers controlled by the digital signals.

The method 1000 further includes using one or more analog time delay circuits coupled to signal input nodes of the digitally controlled analog signal amplifiers, causing one or more delays of signals input into the digitally controlled analog signal amplifiers (act 1004). At least a portion of the digital signals are as a result of a digital closed loop control circuit coupled to the digitally controlled analog signal amplifiers digitally controlling the gain of the digitally controlled analog signal amplifiers.

The method 1000 may further include digitally controlling the analog time delay circuits to control a length of delay implemented by the analog time delay circuits. The analog time delay circuits are coupled to the digital closed loop control circuit to allow the digital closed loop control circuit to digitally control signal delay.

The method 1000 may be practiced where digitally controlling the analog time delay circuits comprises digitally selecting transmission lines for selecting delay using RF switches configured to select between the transmission lines.

The method 1000 may be practiced where digitally controlling the analog time delay circuits comprises digitally shifting signal phase to control length of delay.

The method 1000 may be practiced where controlling one or more digitally controlled analog signal amplifiers causes a gain of less than the absolute value of 1 so as to implement an attenuator.

In some embodiments, the method 1000 is performed to implement a dynamic channel emulator by including a plurality of amplifier and delay circuit pairs, each amplifier and delay circuit pair used to simulate a changing path in a multipath channel.

In some embodiments, the method 1000 is performed to implement an analog finite impulse response (FIR) filter by including a plurality of fixed analog time delay circuits and corresponding digitally controlled analog signal amplifiers.

In some embodiments, the method 1000 is performed to implement an analog cascade architecture filter.

In some embodiments, the method 1000 is performed to remove noise in a simultaneous transmit and receive (STAR) system by using the time delay circuits and amplifiers to generate a signal that can be subtracted from a received signal at the STAR system.

In some embodiments, the method 1000 is performed to remove noise in a co-sight interference system by using the time delay circuits and amplifiers to generate a signal that can be subtracted from a received signal at the co-sight interference system.

In some embodiments, the method 1000 is performed to implement a compensation system to use the digitally controlled analog signal amplifiers to compensate for changes in at least one of supply power levels to the system, temperature changes, or age of the system.

In some embodiments, the method 1000 is performed to implement a slope equalizer.

In some embodiments, the method 1000 is performed to implement an analog twin to implement an analog version of a digital system where control of the digital system is translated to control of the analog version of the digital system.

Further, the methods may be practiced by a computer system including one or more processors and computer-readable media such as computer memory. In particular, the computer memory may store computer-executable instructions that when executed by one or more processors cause various functions to be performed, such as the acts recited in the embodiments.

Embodiments of the present invention may comprise or utilize a special purpose or general-purpose computer including computer hardware, as discussed in greater detail below. Embodiments within the scope of the present invention also include physical and other computer-readable media for carrying or storing computer-executable instructions and/or data structures. Such computer-readable media can be any available media that can be accessed by a general purpose or special purpose computer system. Computer-readable media that store computer-executable instructions are physical storage media. Computer-readable media that carry computer-executable instructions are transmission media. Thus, by way of example, and not limitation, embodiments of the invention can comprise at least two distinctly different kinds of computer-readable media: physical computer-readable storage media and transmission computer-readable media.

Physical computer-readable storage media includes RAM, ROM, EEPROM, CD-ROM or other optical disk storage (such as CDs, DVDs, etc.), magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmission media can include a network and/or data links which can be used to carry desired program code means in the form of computer-executable instructions or data structures and which can be accessed by a general purpose or special purpose computer. Combinations of the above are also included within the scope of computer-readable media.

Further, upon reaching various computer system components, program code means in the form of computer-executable instructions or data structures can be transferred automatically from transmission computer-readable media to physical computer-readable storage media (or vice versa). For example, computer-executable instructions or data structures received over a network or data link can be buffered in RAM within a network interface module (e.g., a "NIC"), and then eventually transferred to computer system RAM and/or to less volatile computer-readable physical storage media at a computer system. Thus, computer-readable physical storage media can be included in computer system components that also (or even primarily) utilize transmission media.

Computer-executable instructions comprise, for example, instructions and data which cause a general purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Alternatively, or in addition, the functionality described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

The present invention may be embodied in other specific forms without departing from its characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A digitally controlled analog filter device comprising:
   one or more digitally controlled analog signal amplifiers, wherein the digitally controlled analog signal amplifiers are configured to have a gain of the digitally controlled analog signal amplifiers controlled by digital signals;
   one or more analog time delay circuits coupled to signal input nodes of the digitally controlled analog signal amplifiers, the analog time delay circuits configured to implement an analog signal delay;
   a digital closed loop control circuit coupled to the digitally controlled analog signal amplifiers to digitally control the gain of the digitally controlled analog signal amplifiers; and
   wherein the device is configured to implement a slope equalizer.

2. The device of claim 1, wherein the analog time delay circuits are digitally controlled to control length of delay implemented by the analog time delay circuits, wherein the analog time delay circuits are coupled to the control circuit to allow the control circuit to digitally control signal delay.

3. The device of claim 2, wherein the analog time delay circuits comprise selectable transmission lines for selecting delay, and RF switches configured to select between the transmission lines.

4. The device of claim 2, wherein the analog time delay circuits comprise a phase shifter to control length of delay.

5. The device of claim 1, wherein the digitally controlled analog signal amplifiers are configured to allow for a gain of less than the absolute value of 1 so as to implement an attenuator.

6. The device of claim 1, wherein the device is configured to implement a dynamic channel emulator by including a plurality of amplifier and delay circuit pairs, each amplifier and delay circuit pair used to simulate a changing path in a multipath channel.

7. The device of claim 1, wherein the device is configured to implement an analog finite impulse response (FIR) filter by including a plurality of fixed analog time delay circuits and corresponding digitally controlled analog signal amplifiers.

8. The device of claim 1, wherein the device is configured to implement an analog cascade architecture filter.

9. The device of claim 1, wherein the device is configured to remove self-generated interference in a simultaneous transmit and receive (STAR) system by using the time delay circuits and amplifiers to generate a signal that can be subtracted from a received signal at the STAR system.

10. The device of claim 1, wherein the device is configured to remove noise in a co-site interference system by using the time delay circuits and amplifiers to generate a signal that can be subtracted from a received signal at the co-site interference system.

11. The device of claim 1, wherein the device is configured to implement a compensation system to use the digitally controlled analog signal amplifiers to compensate for changes in at least one of supply power levels to the system, temperature changes, or age of the system.

12. The device of claim 1, wherein the slope equalizer compensates for the slope of the filter device.

13. The device of claim 1, wherein the slope equalizer is a programmable slope equalizer that adjust over time and environment, and compensates for the slope of the filter device.

14. The device of claim 1, wherein the device is configured to implement an analog twin to implement an analog version of a digital system where control of the digital system is translated to control of the analog version of the digital system.

15. A method of digitally controlling an analog filter device, the method comprising:
   using digital signals, controlling one or more digitally controlled analog signal amplifiers, wherein the digitally controlled analog signal amplifiers are configured to have a gain of the digitally controlled analog signal amplifiers controlled by the digital signals;
   using one or more analog time delay circuits coupled to signal input nodes of the digitally controlled analog signal amplifiers, causing one or more delays of signals input into the digitally controlled analog signal amplifiers;
   wherein at least a portion of the digital signals are as a result of a digital closed loop control circuit coupled to the digitally controlled analog signal amplifiers digitally controlling the gain of the digitally controlled analog signal amplifiers; and
   using a slope equalizer in the filter device to compensate for the slope of the filter device.

16. The method of claim 15, further comprising digitally controlling the analog time delay circuits to control a length of delay implemented by the analog time delay circuits, wherein the analog time delay circuits are coupled to the digital closed loop control circuit to allow the digital closed loop control circuit to digitally control signal delay.

17. The method of claim 16, wherein digitally controlling the analog time delay circuits comprises digitally selecting transmission lines for selecting delay using RF switches configured to select between the transmission lines.

18. The method of claim 16, wherein digitally controlling the analog time delay circuits comprises digitally shifting signal phase to control length of delay.

19. A system for digitally controlling an analog filter device, the system comprising:
   one or more processors; and
   one or more computer-readable media having stored thereon instructions that are executable by the one or more processors to configure the computer system to digitally control an analog filter device, including instructions that are executable to configure the computer system to perform at least the following:
      using digital signals, controlling one or more digitally controlled analog signal amplifiers, wherein the digitally controlled analog signal amplifiers are configured to have a gain of the digitally controlled analog signal amplifiers controlled by the digital signals;
      using one or more analog time delay circuits coupled to signal input nodes of the digitally controlled analog signal amplifiers, causing one or more delays of signals input into the digitally controlled analog signal amplifiers;
      wherein at least a portion of the digital signals are as a result of a digital closed loop control circuit coupled to the digitally controlled analog signal amplifiers digitally controlling the gain of the digitally controlled analog signal amplifiers; and
      using a slope equalizer in the filter device to compensate for the slope of the filter device.

20. The system of claim 19, wherein one or more computer-readable media further have stored thereon instructions that are executable by the one or more processors to configure the computer system to digitally control the analog time delay circuits to control a length of delay implemented by the analog time delay circuits, wherein the analog time delay circuits are coupled to the digital closed loop control circuit to allow the digital closed loop control circuit to digitally control signal delay.

21. The system of claim 20, wherein digitally controlling the analog time delay circuits comprises digitally selecting transmission lines for selecting delay using RF switches configured to select between the transmission lines.

22. The system of claim 19, wherein using a slope equalizer to compensate for the slope of the filter device comprises adjusting the slope equalizer over time and environment.

* * * * *